United States Patent [19]

Avery

[11] Patent Number: 4,595,941
[45] Date of Patent: Jun. 17, 1986

[54] PROTECTION CIRCUIT FOR INTEGRATED CIRCUIT DEVICES

[75] Inventor: Leslie R. Avery, Flemington, N.J.

[73] Assignee: RCA Corporation, Princeton, N.J.

[21] Appl. No.: 741,703

[22] Filed: Jun. 7, 1985

Related U.S. Application Data

[63] Continuation of Ser. No. 616,794, Jun. 4, 1984, abandoned, which is a continuation of Ser. No. 212,534, Dec. 3, 1980, abandoned.

[51] Int. Cl.[4] .................. H01L 27/04; H01L 29/78; H01L 29/743; H02H 9/04
[52] U.S. Cl. .................. 357/43; 357/23.13; 357/23.5; 357/38; 357/48; 361/91
[58] Field of Search .................. 357/48, 13, 37, 38, 357/23.13, 23.4, 41; 361/91, 56

[56] References Cited

U.S. PATENT DOCUMENTS

| | | | |
|---|---|---|---|
| 3,432,731 | 3/1969 | Whittier | 357/38 |
| 3,739,236 | 6/1973 | Loro | 357/38 |
| 3,831,187 | 8/1974 | Neilson | 357/38 |
| 3,858,235 | 12/1974 | Schild | 357/35 |
| 4,224,634 | 9/1980 | Svedberg | 357/23 R |
| 4,244,000 | 1/1981 | Ueda et al. | 357/38 |
| 4,271,445 | 6/1981 | Hartman et al. | 357/38 |
| 4,282,555 | 8/1981 | Svedberg | 357/38 |
| 4,331,884 | 5/1982 | Svedberg | 357/23 R |
| 4,396,932 | 8/1983 | Alonas et al. | 357/23 R |

FOREIGN PATENT DOCUMENTS

| | | |
|---|---|---|
| 0014435 | 8/1980 | European Pat. Off. . |
| 2951421 | 9/1980 | Fed. Rep. of Germany . |
| 2181052 | 11/1973 | France . |
| 1094336 | 12/1967 | United Kingdom . |
| 1119297 | 7/1968 | United Kingdom . |
| 1367325 | 9/1974 | United Kingdom . |
| 1585790 | 3/1981 | United Kingdom . |

OTHER PUBLICATIONS

Hamilton & Howard, Basic Integrated Circuit Engineering, (McGraw-Hill, NY, 1975), pp. 4-7, 12-13, 18-29.

Primary Examiner—William D. Larkins
Attorney, Agent, or Firm—Birgit E. Morris; Donald S. Cohen

[57] ABSTRACT

The protection circuit is a four layer PNPN device which includes a PMOS IGFET. The device is designed to pass current to ground when large transients are imposed across its two external terminals, thereby protecting the integrated circuit.

7 Claims, 2 Drawing Figures

PROTECTION CIRCUIT FOR INTEGRATED CIRCUIT DEVICES

This is a continuation of Ser. No. 06/616,794 filed June 4, 1984, which was a continuation of Ser. No. 06/212,534 filed Dec. 3, 1980, both now abandoned.

BACKGROUND OF THE INVENTION

The present invention relates to a protection circuit for integrated circuit devices.

Integrated circuits are often damaged by voltage transients which overload one or more individual devices contained within the integrated circuit thereby melting or otherwise destroying the device. Heretofore, various devices and circuits have been employed for protective purposes on integrated circuit structures in order to prevent their destruction by such transients. In the past, diodes and transistor circuits have been used for internal transient protection. While such devices provided some measure of protection to the integrated circuits in which they were included, additional protection has been desired.

SUMMARY OF THE INVENTION

The present invention relates to a protection circuit which provides transient protection for an integrated circuit. The protection circuit comprises a silicon controlled rectifier (SCR) which is constructed as a two terminal device, preferably as a part of the integrated circuit which is to be protected. The protection circuit comprises a PNPN structure in which an insulating layer overlies the N type region which is intermediate to two P type regions. A conductive layer overlies the insulating layer and makes contact to the N type region at the end of the PNPN structure, thereby acting as the gate of the P channel MOS (PMOS) transistor while simultaneously acting as one of the two terminals of the protection circuit. Thus, if there is a transient which is negative with respect to the P type region at the end of the PNPN structure, the PMOS transistor will be turned on and the protection circuit will act like a diode through which the current can flow without harm to the protected circuit.

DETAILED DESCRIPTION OF AN EXEMPLARY EMBODIMENT

Figure 1:
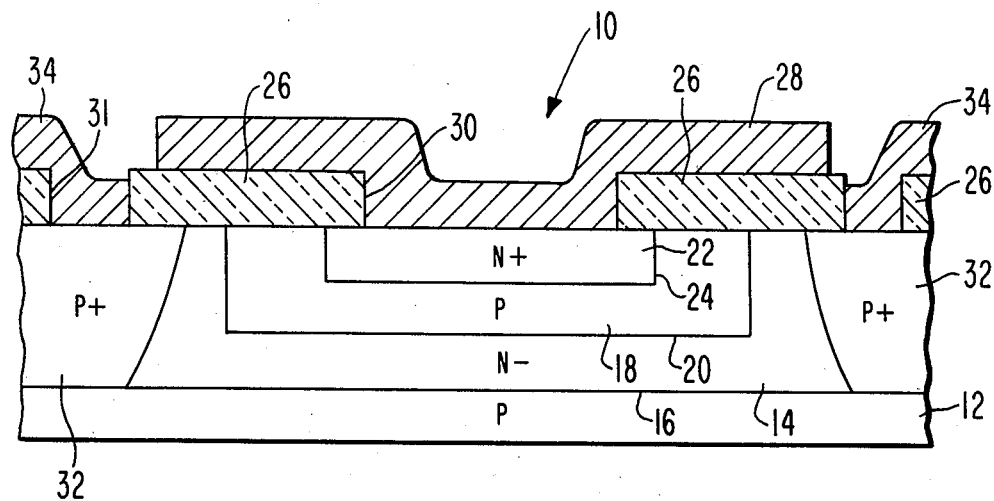
FIG. 1 is a cross-sectional view of the preferred embodiment of the present invention.

Referring to FIG. 1, a cross-sectional view of the protection circuit 10, in accordance with the preferred embodiment of the present invention, is shown. The protection circuit 10 is comprised of a substrate 12, which is P type silicon material in the preferred embodiment of the invention. An N− epitaxial layer 14 forms a PN junction 16 with the P type substrate 12. A P type region 18 is formed within the N type epitaxial layer 14, forming a PN junction 20 with the layer 14. An N+ region 22 is formed within the P type region 18, and it forms a PN junction 24 with the P type region 18.

A P+ region 32 extends from the surface of the device 10 to make ohmic contact to substrate 12. The P+ region 32 preferably surrounds the device 10. A conductor 34 contacts the P+ region 32 adjacent layer 28, as shown in FIG. 1.

An insulating layer 26 overlies the surface of the device 10. In the preferred embodiment of the invention, the insulating layer 26 is comprised of silicon dioxide. A conductive layer 28 overlies the insulating layer 26, overlying the area where the N− type region 14 is adjacent the surface of the device 10, and at least partially overlying the P+ region 32 and the P type region 18. The conductive layer also extends through an aperture 30 in the insulating layer 26 to make contact to the N+ region 22. The conductive layer 28 and the conductor 34 are typically comprised of aluminum, but they may be comprised of any other suitable material, such as a trimetal system.

Figure 2:
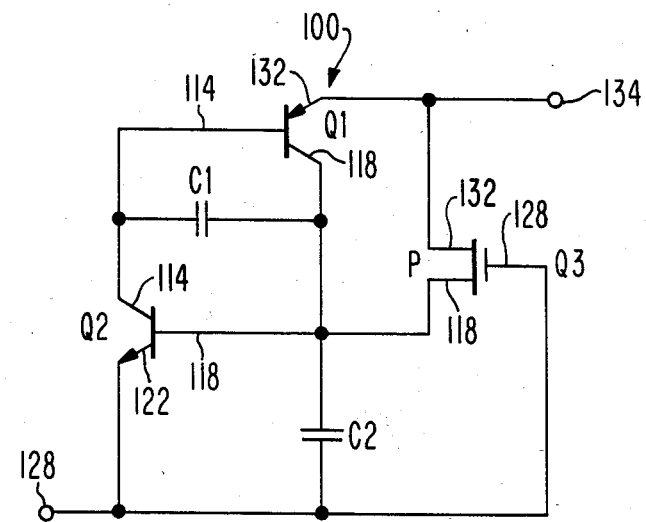
FIG. 2 is a schematic model of the invention.

Referring now to FIG. 2, a schematic representation 100 of the protection circuit 10 of FIG. 1, is shown. In the schematic representation 100, the protection circuit comprises a PNP transistor Q1, an NPN transistor Q2, a P channel insulated gate field effect transistor (IGFET) Q3, and a pair of capacitors C1, C2. Transistor Q1 models the P, N−, P regions 32, 14, 18 of FIG. 1. Accordingly, the emitter, base, and collector of transistor Q1 are referred to using reference numerals 132, 114 and 118, respectively, in the schematic representation 100. Similarly, the transistor Q2 represents the N−, P, and N+ layers 14, 18, 22, respectively, of FIG. 1. Accordingly, the collector, base, and emitter of transistor Q2 are represented by the reference numerals 114 (which is also the base of transistor Q1), 118 (which is also the collector of transistor Q1), and 122, respectively.

Similarly, the IGFET Q3 includes a drain 118, a source 132, and a gate 128 which is also a terminal of the protection circuit 100. The capacitors C1 and C2 model the junction capacitance of the PN junctions 20 and 24 of the structure shown in FIG. 1. The two terminals 128, 134 of the schematic representation 100 correspond to the two metal interconnects 28, 34, respectively.

The protection circuit is similar in operation to a silicon controlled rectifier (SCR) except that it is constructed as a two terminal device which includes a P channel IGFET. Also, the protection circuit is designed to be triggered by either a high voltage across the two terminals 128, 134 or by a high rate of change of voltage (dv/dt) across the two terminals 128, 134. Accordingly, the protection circuit differs from a conventional SCR in that a conventional SCR is a three terminal device which is designed to avoid triggering based upon either the voltage between its anode and cathode or upon the rate of change of voltage between its anode and cathode.

In practice, the conductor 34 (terminal 134) is connected to ground potential, whereas the conductor 28 (terminal 128) is connected across the circuitry which is designed to be protected. Accordingly, if terminal 128 goes negative with respect to ground at a high rate, the protection circuit will be turned on (terminals 128 and 134 will be electrically connected together via a low resistance path as provided when terminals 128 and 134 are in close proximity to each other, as shown in FIG. 1) insuring excess current is passed to ground. Unlike the present protection device, a conventional SCR would have a low value resistor across capacitor C2 which would prevent such firing. In the event that there is a slow change of the voltage on terminal 128, a very small current, on the order of nanoamps, will flow through transistor Q2 without causing the circuit to latch, because the total loop again is selected to be less than 1. When the voltage on terminal 128 is negative enough, IGFET Q3 will turn on causing transistor Q2 to turn on thereby providing sufficient loop gain to insure that the total loop gain is greater than 1. Again, the protection circuit will pass excess current to ground.

In order to manufacture the device of the present invention, one starts with a semiconductor substrate, preferably of P type (100) silicon having a resistivity of about 10 to 30 ohm-cm. An N type epitaxial layer having a resistivity of about 1000 ohms/square is then grown to a thickness of between about 10 and 12 microns. Next, a layer of photoresist is applied over the surface of the device.

The photoresist is defined using a photomask and developed to form openings through which a suitable P type dopant, such as boron nitride, is deposited and diffused to form the P+ isolation regions 32. The P+ isolation regions 32 have a surface conductivity of about 5 ohms/square, and they contact the substrate 12 after diffusion. Next, a new photoresist layer is applied and defined using a second photomask to form an opening where the P type region 18 will be formed. A suitable acceptor impurity is deposited (either directly or by ion implantation), and it is diffused to form the P type region 18 to a depth of approximately 2.1 to 2.2 micrometers. The P type region 18 will preferably have a surface resistivity of about 200 ohms/square.

In a similar manner the N+ region 22 is formed using a third photomask and photolithographic step. Donor impurities are deposited and diffused to form the region 22 with a surface resistivity of approximately 2-5 ohms/square.

Next, the oxide layer 26 is grown and openings are defined and formed therein using another photolithographic step.

Finally, a conductive layer 28 such as an aluminum layer, is applied to the surface of the device. The conductive layer 28 is defined using a fourth photolithographic step, thereby completing the formation of the device 10.

I claim:

1. A semiconductor structure for the protection of integrated circuit devices, comprising:
   (a) a substrate of semiconductor material of a first conductivity type;
   (b) a semiconductor layer of a second conductivity type on the substrate, the semiconductor layer having a surface;
   (c) a first region of the first conductivity type formed in the semiconductor layer to extend into the semiconductor layer from the surface in order to form a PN junction between the first region and the adjacent portions of the semiconductor layer;
   (d) a second region of the second conductivity type formed in the first region to extend into the first region from the surface in order to form a PN junction between the second region and the first region;
   (e) a third region of the first conductivity type extending from the surface through the layer to the substrate, the third region being separated from the first region by a portion of the semiconductor layer which portion extends to the surface;
   (f) an insulating layer formed on the surface of the semiconductor layer to extend over the surface between the second region and the third region and which overlies the portion of the first region which extends to the surface as well as the portion of the semiconductor layer which extends to the surface, and at least portions of the second region and the third region on the surface;
   (g) first conductive means making direct electrical contact to the third region to form one terminal of the semiconductor structure; and
   (h) a second conductive means making direct electrical contact to the second region to form another terminal of the semiconductor structure, the second conductive means extending to and overlapping a portion of the third region and in close proximity to the first conductive means where the first conductive means contacts to the third region.

2. The protection circuit of claim 1 wherein said substrate has P type conductivity.

3. The protection circuit of claim 2 wherein said layer is an epitaxial layer of N type conductivity, said first region is of P type conductivity and said second region is of N type conductivity.

4. The protection circuit of claim 3 wherein said substrate is comprised of silicon.

5. The protection circuit of claim 4 wherein said insulating layer is comprised of silicon dioxide.

6. The protection circuit of claim 5 wherein said conductive means is comprised of a layer of metal overlying said silicon dioxide layer.

7. The protection circuit of claim 6 wherein said third region is a highly doped P type region which extends from the surface of said layer to the underlying P type substrate.

* * * * *